United States Patent
Kalevo

(10) Patent No.: US 10,116,328 B2
(45) Date of Patent: Oct. 30, 2018

(54) ENCODERS, DECODERS AND METHODS UTILIZING MODE SYMBOLS

(71) Applicant: GURULOGIC MICROSYSTEMS OY, Turku (FI)

(72) Inventor: Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 0 days.

(21) Appl. No.: 15/577,680

(22) PCT Filed: Jun. 10, 2016

(86) PCT No.: PCT/EP2016/025058
§ 371 (c)(1),
(2) Date: Nov. 28, 2017

(87) PCT Pub. No.: WO2016/198169
PCT Pub. Date: Dec. 15, 2016

(65) Prior Publication Data
US 2018/0167084 A1    Jun. 14, 2018

(30) Foreign Application Priority Data

Jun. 10, 2015 (GB) .................................. 1510127.2

(51) Int. Cl.
*H03M 7/34*    (2006.01)
*H03M 7/48*    (2006.01)
(Continued)

(52) U.S. Cl.
CPC ........... *H03M 7/48* (2013.01); *H03M 7/4006* (2013.01); *H04L 69/04* (2013.01); *H03M 7/4043* (2013.01); *H03M 7/607* (2013.01)

(58) Field of Classification Search
CPC .............................. H03M 7/48; H03M 7/4006
(Continued)

(56) References Cited

U.S. PATENT DOCUMENTS 8,675,731 B2    3/2014 Kalevo et al.
8,754,791 B1    6/2014 Kalevo
(Continued)

FOREIGN PATENT DOCUMENTS

CN    1949670 A    4/2007
GB    1412937 A    11/1975
(Continued)

OTHER PUBLICATIONS

Run-length encoding—Wikipedia, the free encyclopedia (accessed Mar. 25, 2015); URL: http://en.wikipedia.org/wiki/Run-length encoding, pp. 1-3.
Thinh Nguyen: "Lecture 7: Run-Length, Golomb, and Tunstall Codes", internet article, May 9, 20016, XP002762453, Retrieved from the Internet: URL:http://web.engr.oregonstate.edu/~thinhq/teaching/ece499/spring06/runlength_turnstall_golomb.pdf [retrieved on Sep. 29, 2016], p. 4.
(Continued)

*Primary Examiner* — Lam T Mai
(74) *Attorney, Agent, or Firm* — Eric L. Sophir; Dentons US LLP

(57) ABSTRACT

An encoder is provided. The encoder is configured to analyze input data to identify at least one mode symbol therein. The encoder is configured to generate data values of a first type including non-mode symbols and data values of a second type including runs of the at least one mode symbol. Moreover, the encoder is configured to generate information that is indicative of a count of the non-mode symbols and information that is indicative of the at least one mode symbol. Furthermore, the encoder is configured to assemble or encode the information that is indicative of the at least one mode symbol, the information that is indicative of the count of the non-mode symbols, the data values of the first type including the non-mode symbols and the data values of the second type including the runs of the at least one mode symbol, to generate encoded data.

26 Claims, 3 Drawing Sheets

(51) Int. Cl.
*H04L 29/06* (2006.01)
*H03M 7/40* (2006.01)
*H03M 7/30* (2006.01)

(58) Field of Classification Search
USPC .................................................. 341/51–55
See application file for complete search history.

(56) References Cited

U.S. PATENT DOCUMENTS

| | | | |
|---|---|---|---|
| 8,823,560 | B1 | 9/2014 | Karkkainen et al. |
| 8,933,826 | B2 | 1/2015 | Kalevo |
| 2012/0326984 | A1* | 12/2012 | Ghassabian ........... G06F 3/0236 345/168 |
| 2014/0044191 | A1 | 2/2014 | Kalevo et al. |
| 2017/0228123 | A1* | 8/2017 | Ghassabian ........... G06F 1/1626 |

FOREIGN PATENT DOCUMENTS

| | | |
|---|---|---|
| GB | 2523348 A | 8/2015 |
| WO | 2005/043921 A1 | 5/2005 |
| WO | 2010/115789 A1 | 11/2010 |
| WO | 2016/198169 A1 | 12/2016 |

OTHER PUBLICATIONS

Proposal for a new zlib strategy: Z_RLE (accessed Mar. 25, 2015); URL: <http://optipng.sourceforge.net/pngtech/z_rle.html>.
Notification of Transmittal of the International Search Report and the Written Opinion of the International Searching Authority, or the Declaration issued in International Application No. PCT/EP2016/025058 dated Oct. 11, 2016.
Notification of Transmittal of the International Preliminary Report on Patentability issued in International Application No. PCT/EP2016/025058 dated Sep. 18, 2017.
Notification of Grant in Patent Serial No. GB2539239 dated Sep. 5, 2017.
Patents Act 1977: Intention to Grant under Section 18(4) in Application No. GB1510127.2 dated Jul. 24, 2017.
Examination Report under Section 18(3) dated May 15, 2017.
Patents Act 1977: Response made to Report under Section 18(3) dated Oct. 19, 2016.
Combined Search and Examination Report under Sections 17 and 18(3) dated Dec. 23, 2015.
Written Opinion of the International Preliminary Examining Authority issued in International Application No. PCT/EP2016/025058 dated May 24, 2017.

* cited by examiner

ENCODERS, DECODERS AND METHODS UTILIZING MODE SYMBOLS

CROSS-REFERENCE TO RELATED APPLICATIONS

This application is a National Stage of PCT/EP2016/025058, filed Jun. 10, 2016, which claims priority under 35 U.S.C. § 119 GB Application No. 1510127.2, filed Jun. 10, 2015, all of which are incorporated herein by reference in their entirety.

TECHNICAL FIELD

The present disclosure relates to encoders for encoding input data (D1) to generate corresponding encoded data (E2), and corresponding methods of encoding input data (D1) to generate corresponding encoded data (E2). Moreover, the present disclosure relates to decoders for decoding encoded data (E2) to generate corresponding decoded data (D3), and corresponding methods of decoding encoded data (E2) to generate corresponding decoded data (D3). Furthermore, the present disclosure is concerned with computer program products comprising a non-transitory computer-readable storage medium having computer-readable instructions stored thereon, the computer-readable instructions being executable by a computerized device comprising processing hardware to execute aforesaid methods. Additionally, the present disclosure concerns codecs including at least one aforementioned encoder and at least one aforementioned decoder.

BACKGROUND

Run Length Encoding (RLE) is an encoding method that can be used to compress data by reducing an associated count of symbols, which is achieved by separately delivering consecutive runs of the symbols (see reference [1]). Moreover, Split RLE or SRLE (see reference [2]) is a version of RLE that can be used to deliver and compress the symbols and the consecutive runs of the symbols separately.

There are multiple different implementations of RLE that are contemporarily available. As an example, in some implementations, consecutive runs can be delivered for all different symbols. In other implementations, the consecutive runs are delivered only when there are at least two similar symbols in a symbol stream.

Furthermore, ZRLE (see reference [3]) is one special version of RLE that separately delivers non-zero values, and runs of zero values before non-zero values. ZRLE is an efficient method when given data contains a lot of zero values. ZRLE is used, for example, when quantized Discrete Cosine Transform (DCT) coefficients are compressed in Joint Photographic Experts Group (JPEG) compression.

The aforementioned RLE and SRLE can be used for bits, numbers or symbols, whereas ZRLE can be used only for numbers.

RLE and SRLE are efficient methods only in a case where there are a lot of consecutive symbols in the data, but none of those symbols is a dominant symbol. ZRLE is an efficient method only when "zero" is a dominant value in the data.

Unfortunately, when JPEG uses the ZRLE method, zero is not always the dominant value, especially when a desired quality is high and a quantization rate is low. This makes the ZRLE method very inefficient to use in such circumstances.

Therefore, there exists a need for alternative encoding methods that address shortcomings associated with known methods of encoding data, for example as aforementioned. These shortcomings relate, for example, to a degree of data compression that is achievable.

In a published article "*Thinh Nguyen: "Lecture 7: Run-Length, Golomb, and Tunstall Codes*", there is described a general binary Run-Length Encoding, wherein only one stream, namely runs of Zero values, is generated.

SUMMARY

The present disclosure seeks to provide an improved encoder for encoding input data (D1) to generate corresponding encoded data (E2).

Moreover, the present disclosure seeks to provide an improved decoder for decoding encoded data (E2) to generate corresponding decoded data (D3).

A further aim of the present disclosure is to at least partially overcome at least some of the problems of the prior art, as discussed above.

In a first aspect, embodiments of the present disclosure provide an encoder for encoding input data (D1) to generate corresponding encoded data (E2), characterized in that:
the encoder (110) is configured to:
(a) analyze the input data (D1) to identify at least one mode symbol therein;
(b) generate data values of at least a first type and a second type from the input data (D1), wherein the data values of the first type include non-mode symbols, and the data values of the second type include runs of the at least one mode symbol, wherein the at least mode symbol is a symbol that occurs most often in the input data (D1) and the non-mode symbols are symbols other than the at least one mode symbol, wherein the runs of the at least one mode symbol are indicative of occurrences of the at least one mode symbol before or after the non-mode symbols within the input data (D1);
(c) generate information that is indicative of a count of the non-mode symbols in the input data (D1) and information that is indicative of the at least one mode symbol; and
(d) assemble or encode the information that is indicative of the at least one mode symbol, the information that is indicative of the count of the non-mode symbols, the data values of the first type including the non-mode symbols and the data values of the second type including the runs of the at least one mode symbol, to generate the encoded data (E2).

The present invention is of advantage in that the aforementioned encoder is capable of achieving a higher compression ratio for generating lossless compressed data as compared to other known conventional compression methods, when the input data (D1) includes at least one dominant symbol, namely the at least one mode symbol.

Moreover, the encoded data (E2) so generated is susceptible to being decoded rapidly, as compared to conventional entropy coding methods.

It is to be noted that the aforementioned encoder can be used for different types of symbols, for example, including numbers, bits, alphanumeric characters, words, and so forth.

It will be appreciated that one or more result streams can be entropy-coded. When several mode values occur, then there can be really many streams, because each mode value always produces two streams when SMRLE is used, and only one stream when MRLE is used. Thus, embodiments of the present disclosure also include an implementation where only one stream is generated when, for example MRLE, is used.

Optionally, the encoder is operable to insert the data values of the first type and the data values of the second type into one or more data streams, prior to (d).

According to an embodiment of the present disclosure, when inserting into the one or more data streams, the encoder is configured to insert the data values of the first type and the data values of the second type into separate data streams. Optionally, in this regard, the data values of the first type and the data values of the second type are inserted into a first data stream and a second data stream, respectively. Optionally, in this regard, the encoder is configured to process recursively the first data stream including the data values of the first type, namely the non-mode symbols, pursuant to (a) to (d).

According to another embodiment of the present disclosure, when inserting into the one or more data streams, the encoder is configured to insert the data values of the first type and the data values of the second type in an interleaved format or a planar format into a single data stream.

Alternatively, optionally, when the data values of the first type and the data values of the second type are inserted into the first and second data streams, the encoder is configured to combine the first and second data streams to form a single resultant data stream either in the interleaved format or in the planar format.

Optionally, the encoder is configured to interleave the data values of the first and second types to provide the single resultant data stream.

Optionally, the encoder is configured to interleave the data values of the first and second types as interleaved data blocks to provide the single resultant data stream.

Moreover, it is to be noted here that in the planar format, all the data values of the first type are inserted into the single resultant data stream, followed by all the data values of the second type, or vice versa.

Moreover, optionally, the configured is operable to employ at least one entropy encoding method to compress the one or more data streams either together or separately. Optionally, in this regard, the at least one entropy encoding method includes at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, TrueBits Copy coding. These at least one encoding method are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

Optionally, the encoder is configured to assemble or encode additional information relating to delivery of at least one of: probability and index tables, mode symbols, counts of mode symbols, indices of selected encoding methods, data values, maximum indices of different data.

Optionally, in this regard, the encoder is configured to deliver, to at least one decoder, an index that is indicative of at least one of: a selected encoding method, the at least one mode symbol, the count of mode symbols, whether or not the at least one mode symbol is communicated in the encoded data (E2).

Optionally, the encoder is configured to deliver the aforesaid additional information as prior information before delivery of the encoded data (E2). Alternatively, optionally, the encoder is configured to deliver the additional information together with the encoded data (E2) as apart of the encoded data (E2).

Optionally, the encoder is configured to generate symbols in the input data (D1) prior to (a) to (d) by splitting or combining original symbols present in the input data (D1). Optionally, in this regard, the encoder is configured:
(i) to split at least one or more portions of the input data (D1) to generate one or more new symbols for processing pursuant to (a) to (d); and/or
(ii) to combine one or more alphanumeric characters of at least one or more portions of the input data (D1) to generate new combined symbols for processing pursuant to (a) to (d).

Optionally, the encoder is configured to employ additional encoding methods for encoding one or more portions of the input data (D1), wherein the additional methods include at least one of: Delta encoding, ODelta encoding, RLE encoding, SRLE encoding, ZRLE encoding, MRLE encoding, SMRLE encoding, Huffman coding, Variable-Length Code (VLC) encoding, Range coding, Arithmetic coding, Entropy Modifying (EM) encoding, Continuum operator encoding, TrueBits Copy coding. These at least one additional methods are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

Optionally, the encoder is configured to dynamically select, from amongst a plurality of encoding algorithms, an encoding algorithm to be employed in (a) to (d), depending upon one or more properties of the input data (D1), to obtain an improved degree of data compression in the encoded data (E2).

In a second aspect, embodiments of the present disclosure provide a method of encoding input data (D1) in a encoder (110) to generate corresponding encoded data (E2), characterized in that the method includes configuring the encoder (110) to:
(a) analyze the input data (D1) to identify at least one mode symbol therein;
(b) generate data values of at least a first type and a second type from the input data (D1), wherein the data values of the first type include non-mode symbols, and the data values of the second type include runs of the at least one mode symbol, wherein the at least one mode symbol is a symbol that occurs most often in the input data (D1) and the non-mode symbols are symbols other than the at least one mode symbol, wherein the runs of the at least one mode symbol are indicative of occurrences of the at least one mode symbol before or after the non-mode symbols within the input data (D1);
(c) generate information that is indicative of a count of the non-mode symbols in the input data (D1) and information that is indicative of the at least one mode symbol; and
(d) assemble or encode the information that is indicative of the at least one mode symbol, the information that is indicative of the count of the non-mode symbols, the data values of the first type including the non-mode symbols and the data values of the second type including the runs of the at least one mode symbol, to generate the encoded data (E2).

Optionally, the method includes inserting the data values of the first type and the data values of the second type into one or more data streams, prior to step (d).

According to an embodiment of the present disclosure, when inserting into the one or more data streams, the method includes inserting the data values of the first type and the data values of the second type into separate data streams.

Optionally, in this regard, the data values of the first type and the data values of the second type are inserted into a first data stream and a second data stream, respectively.

Optionally, the method includes recursively processing the first data stream including the non-mode symbols pursuant to (a) to (d).

According to another embodiment of the present disclosure, when inserting into the one or more data streams, the method includes inserting the data values of the first type and the data values of the second type in an interleaved format or a planar format into a single data stream.

Alternatively, optionally, when the data values of the first type and the data values of the second type are inserted into the first and second data streams, the method includes combining the first and second data streams to form a single resultant data stream either in the interleaved format or in the planar format. Moreover, optionally, the method includes employing at least one entropy encoding method to compress the one or more data streams either together or separately. Optionally, in this regard, the at least one entropy encoding method includes at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, TrueBits Copy coding.

Optionally, the method includes assembling or encoding additional information relating to delivery of at least one of: probability and index tables, mode symbols, counts of mode symbols, indices of selected encoding methods, data values, maximum indices of different data.

Optionally, in this regard, the method includes delivering, to at least one decoder, an index that is indicative of at least one of: a selected encoding method, the at least one mode symbol, the count of mode symbols, whether or not the at least one mode symbol is communicated in the encoded data (E2).

Optionally, the method includes delivering the aforesaid additional information as prior information before delivery of the encoded data (E2). Alternatively, optionally, the method includes delivering the additional information together with the encoded data (E2) as a part of the encoded data (E2).

Optionally, the method includes generating symbols in the input data (D1) prior to (a) to (d) by splitting or combining original symbols present in the input data (D1). Optionally, in this regard, the method includes:
(i) splitting at least one or more portions of the input data (D1) to generate one or more new symbols for processing pursuant to (a) to (d); and/or
(ii) combining one or more alphanumeric characters of at least one or more portions of the input data (D1) to generate new combined symbols for processing pursuant to (a) to (d).

Optionally, the method includes employing additional encoding methods for encoding one or more portions of the input data (D1), wherein the additional methods include at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, TrueBits Copy coding.

Optionally, the method includes dynamically selecting, from amongst a plurality of encoding algorithms, an encoding algorithm to be employed in (a) to (d), depending upon one or more properties of the input data (D1), to obtain an improved degree of data compression in the encoded data (E2).

In a third aspect, embodiments of the present disclosure provide a decoder for decoding encoded data (E2) to generate corresponding decoded data (D3), characterized in that:
(i) the decoder is configured to decode from the encoded data (E2) information that is indicative of at least one mode symbol, information that is indicative of a count of non-mode symbols, data values of at least a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data (D1); and
(ii) the decoder is configured to insert before or after the non-mode symbols corresponding runs of the at least one mode symbol to generate the decoded data (D3).

Optionally, the decoder is configured to receive within the encoded data (E2) one or more data streams including the data values of the first type and the data values of the second type.

According to an embodiment of the present disclosure, the data values of the first type and the data values of the second type are received in separate data streams.

According to another embodiment of the present disclosure, the data values of the first type and the data values of the second type are received in an interleaved format or a planar format in a single data stream.

Optionally, the decoder is configured to employ an inverse of at least one entropy encoding method employed to compress the one or more data streams either together or separately at a corresponding encoder.

Optionally, the decoder is configured to recursively process (i) to (ii) for each mode symbol to generate the decoded data (D3), when more than one mode symbol are employed in the encoded data (E2).

According to an embodiment, the decoder is configured to receive additional information relating to at least one of: probability and index tables, mode symbols, counts of mode symbols, indices of selected encoding methods, data values, maximum indices of different data.

Optionally, in this regard, the decoder is configured to receive, from a corresponding encoder, an index that is indicative of at least one of: a selected encoding method, the at least one mode symbol, the count of mode symbols, whether or not the at least one mode symbol is communicated in the encoded data (E2).

Optionally, the decoder is configured to receive the aforesaid additional information as prior information before receipt of the encoded data (E2). Alternatively, optionally, the decoder is configured to receive the additional information together with the encoded data (E2) as a part of the encoded data (E2).

Optionally, when the encoded data (E2) has been encoded using additional encoding methods, the decoder is configured to decode the encoded data (E2) in a reverse order of processing steps to an order of processing steps employed during encoding of original input data (D1) to generate the encoded data (E2) by a corresponding encoder. In this regard, optionally, the decoder is operable to employ additional decoding methods, wherein the additional decoding methods include at least one of: Delta decoding, ODelta decoding, RLE decoding, SRLE decoding, ZRLE decoding, MRLE decoding, SMRLE decoding, Huffman decoding, VLC decoding, Range decoding, Arithmetic decoding, Entropy Modifying (EM) decoding, Continuum operator decoding, TrueBits Copy decoding. These additional methods are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

In a fourth aspect, embodiments of the present disclosure provide a method of decoding encoded data (E2) to generate corresponding decoded data (D3), characterized in that the method includes:

(i) decoding from the encoded data (E2) information that is indicative of at least one mode symbol, information that is indicative of a count of non-mode symbols, data values of at least a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data (D1); and (ii) inserting before or after the non-mode symbols corresponding runs of the at least one mode symbol to generate the decoded data (D3).

Optionally, the method includes receiving within the encoded data (E2) one or more data streams including the data values of the first type and the data values of the second type.

According to an embodiment of the present disclosure, the data values of the first type and the data values of the second type are received in separate data streams.

According to another embodiment of the present disclosure, the data values of the first type and the data values of the second type are received in an interleaved format or a planar format in a single data stream.

Optionally, the method includes employing an inverse of at least one entropy encoding method employed to compress the one or more data streams either together or separately at a corresponding encoder.

Optionally, the method includes recursively processing (i) to (ii) for each mode symbol to generate the decoded data (D3), when more than one mode symbol are employed in the encoded data (E2).

According to an embodiment, the method includes receiving additional information relating to at least one of: probability and index tables, mode symbols, counts of mode symbols, indices of selected encoding methods, data values, maximum indices of different data.

Optionally, in this regard, the method includes receiving, from a corresponding encoder, an index that is indicative of at least one of: a selected encoding method, the at least one mode symbol, the count of mode symbols, whether or not the at least one mode symbol is communicated in the encoded data (E2).

Optionally, the method includes receiving the aforesaid additional information as prior information before receipt of the encoded data (E2). Alternatively, optionally, the method includes receiving the additional information together with the encoded data (E2) as a part of the encoded data (E2).

Optionally, when the encoded data (E2) has been encoded using additional encoding methods, the method includes decoding the encoded data (E2) in a reverse order of processing steps to an order of processing steps employed during encoding of original input data (D1) to generate the encoded data (E2) by a corresponding encoder. In this regard, optionally, the method includes employing additional decoding methods, wherein the additional decoding methods include at least one of: Delta decoding, ODelta decoding, RLE decoding, SRLE decoding, ZRLE decoding, MRLE decoding, SMRLE decoding, Huffman decoding, VLC decoding, Range decoding, Arithmetic decoding, Entropy Modifying (EM) decoding, Continuum operator decoding, TrueBits Copy decoding. These additional methods are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

In a fifth aspect, embodiments of the present disclosure provide a codec including at least one encoder for encoding input data (D1) to generate corresponding encoded data (E2) pursuant to the aforementioned first aspect, and at least one decoder for decoding the encoded data (E2) to generate corresponding decoded data (D3) pursuant to the aforementioned third aspect.

In a sixth aspect, embodiments of the present disclosure provide a computer program product comprising a non-transitory computer-readable storage medium having computer-readable instructions stored thereon, the computer-readable instructions being executable by a computerized device comprising processing hardware to execute any of the aforementioned methods pursuant to the aforementioned second or fourth aspects.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
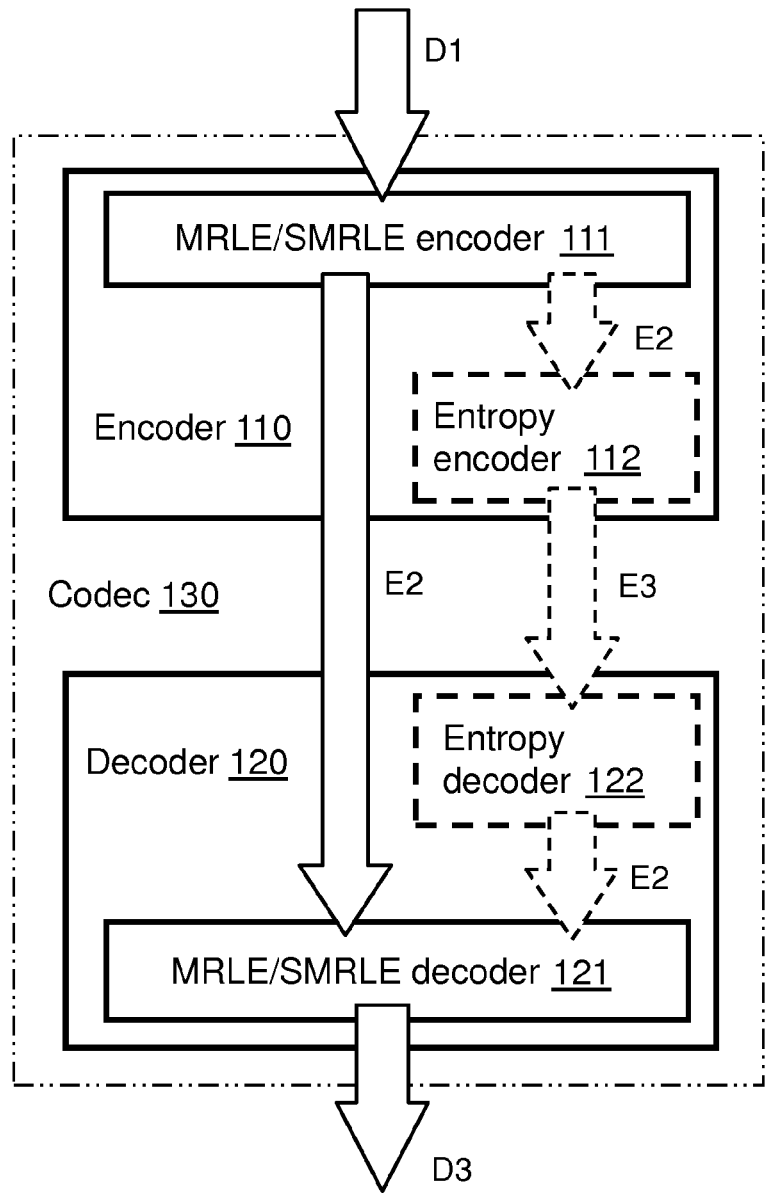
FIG. 1 is a schematic illustration of an encoder for encoding input data (D1) to generate corresponding encoded data (E2) and a decoder for decoding the encoded data (E2) to generate corresponding decoded data (D3), wherein the encoder and the decoder collectively form a codec, in accordance with an embodiment of the present disclosure, and wherein an optional entropy encoder reduces the entropy of the encoded data (E2) to produce entropy-compressed encoded data (E3), and wherein an optional entropy decoder decompresses the entropy-compressed encoded data (E3) back to the encoded data (E2) so that it can be decoded into decoded data (D3)

In the accompanying diagrams, an underlined number is employed to represent an item over which the underlined number is positioned or an item to which the underlined number is adjacent. A non-underlined number relates to an item identified by a line linking the non-underlined number to the item.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In a first aspect, embodiments of the present disclosure provide an encoder for encoding input data (D1) to generate corresponding encoded data (E2), characterized in that:

(a) the encoder is configured to analyze the input data (D1) to identify at least one mode symbol therein;

(b) the encoder is configured to generate data values of at least a first type and a second type, wherein the data values of the first type include non-mode symbols, and the data values of the second type include runs of the at least one mode symbol, wherein the runs of the at least one mode symbol are indicative of occurrences of the at least one mode symbol before or after the non-mode symbols within the input data (D1);

(c) the encoder is configured to generate information that is indicative of a count of the non-mode symbols and information that is indicative of the at least one mode symbol; and (d) the encoder is configured to assemble or encode the information that is indicative of the at least one mode symbol, the information that is indicative of the count of the non-mode symbols, the data values of the first type including the non-mode symbols and the data values of the second type including the runs of the at least one mode symbol, to generate the encoded data (E2).

The input data (D1) can be any sort of data that can be represented with symbols. Examples of symbols include, but are not limited to, alphabetical characters, alphanumeric characters, numeric characters, and sequences thereof. Moreover, the input data (D1) can be original data, source data, data processed with some other encoding method, or a stream of data. Examples of the input data (D1) include, but are not limited to, binary data, text data, audio data, image data, video data, measurement data, sensor data, biometric data, biological genetic data, genome data, transform coefficient data, transformed data, processed data, and partial data.

With reference to the aforementioned transform coefficient data and the aforementioned transformed data, some examples of associated transformations in respect of the input data (D1) concerned, coefficients of which are capable of being employed, in respect of the aforementioned method or methods pursuant to the present disclosure include:

DCT (Discrete Cosine Transform), DFT/FFT (Discrete/Fast Fourier Transform), Hadamard transform, Haar transform, wavelets, DST (Discrete Sine Transform), KLT (Karhunen-Loeve Transform), linear transformations, affine transformations, reflections, translations, rotations, scaling, shear, multilevel coding, ODelta coding, quantization, color space transformations, linear filters (FIR, IIR), non-linear transforms (partial functions) and non-linear filters (median, mode), but not limited thereto. Such aforementioned transformations are optionally used to process the input data (D1) prior to corresponding processed data being employed by the method or methods pursuant to the present disclosure. These transformations are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

The aforementioned encoder is very efficient when there is at least one dominant symbol in the input data (D1). Throughout the present disclosure, the term "mode symbol" refers to a symbol that is dominant in the input data (D1), while the term "non-mode symbol" refers to a symbol that is not dominant in the input data (D1). In other words, a mode symbol is a symbol that occurs most often in the input data (D1), while a non-mode symbol is a symbol other than the mode symbol.

It will be appreciated that "mode" is not same as "zero", although mode symbols can sometimes be equal to zero in value, if zero is a most dominant value in given input data (D1).

It is to be noted here that there can be more than one mode symbol in the input data (D1), and embodiments of the present disclosure can be implemented in a similar manner for a case where there are more than one mode symbol. Optionally, in such a case, the encoder is configured to recursively process (a) to (d) for each mode symbol.

According to an embodiment, the encoder is configured to generate symbols in the input data (D1) prior to (a) to (d) by splitting or combining original symbols present in the input data (D1). Optionally, in this regard, the encoder is configured:

(i) to split at least one or more portions of the input data (D1) to generate one or more new symbols for processing pursuant to (a) to (d); and/or (ii) to combine one or more alphanumeric characters of at least one or more portions of the input data (D1) to generate new combined symbols for processing pursuant to (a) to (d).

In order to illustrate how the input data (D1) can be split in (i), there will now be considered an example where an input data stream (D1) is a bit stream including 24 bits as follows:

1, 0, 0, 0, 0, 1, 1, 1, 1, 0, 1, 1, 1, 0, 0, 0, 1, 0, 0, 0, 1, 0, 1, 1

The bit stream can be split into N-bit symbols that can then be compressed pursuant to (a) to (d). In the example herein, portions of the bit stream can be split to generate new 4-bit symbols as follows:

(1, 0, 0, 0), (0, 1, 1, 1), (1, 0, 1, 1), (1, 0, 0, 0), (1, 0, 0, 0), (1, 0, 1, 1)

Hereinabove, the new 4-bit symbols are separated by brackets, for the sake of clarity only.

Next, in order to illustrate how alphanumeric characters can be combined in (ii), there will now be considered an example where an input data stream (D1) includes 20 alphanumeric characters as follows:

A, B, B, A, A, A, B, B, A, B, A, B, A, B, B, A, B, B, A, A

In the example herein, certain sequences of alphanumeric characters, namely 'A, B, B', 'A, A' and 'A, B' occur repeatedly. Therefore, these alphanumeric characters can be combined to generate new combined symbols as follows: ABB, AA, ABB, AB, AB, ABB, ABB, AA The processing pursuant to (a) to (d) can then be applied on the new symbols.

Optionally, the encoder is configured to insert the data values of the first type and the data values of the second type into one or more data streams, prior to (d).

According to an embodiment of the present disclosure, when inserting into the one or more data streams, the encoder is configured to insert the data values of the first type and the data values of the second type into separate data streams. Optionally, in this regard, the data values of the first type and the data values of the second type are inserted into a first data stream and a second data stream, respectively.

Optionally, in this regard, the encoder is configured to process recursively the first data stream including the data values of the first type, namely the non-mode symbols, pursuant to (a) to d). In such a case, each time a recursion is performed, two different types of data values are generated for a given mode symbol. As a result, the count of different types of data values, and thus the count of different data streams, encoded into the encoded data (E2) is equal to the number of recursions performed plus one. Notably, the number of recursions is equal to the count of mode symbols differing from the original symbols. In other words, the count of mode symbols indicates how many recursions were performed during encoding. It is to be noted here that the first data stream, namely the data values of the first type, are generated after a previous mode symbol is removed from the input data (D1). Thus, the first data stream can be processed recursively pursuant to (a) to (d), if at least one of the data values included in the first data stream distinctly stands out as a mode symbol.

Moreover, optionally, the encoder is configured to recursively process the second data stream including the runs of the at least one mode symbol pursuant to (a) to (d). This is particularly beneficial in cases when a particular run value is a distinct mode symbol.

An example of how the recursive processing can be performed is provided later.

According to another embodiment of the present disclosure, when inserting into the one or more data streams, the encoder is configured to insert the data values of the first type and the data values of the second type in an interleaved format or a planar format into a single data stream.

Alternatively, optionally, when the data values of the first type and the data values of the second type are inserted into the first and second data streams, the encoder is configured to combine the first and second data streams to form a single resultant data stream either in the interleaved format or in the planar format.

According to an embodiment, the encoder is configured to interleave the data values of the first and second types to provide the single resultant data stream. According to another embodiment, the encoder is configured to interleave the data values of the first and second types as interleaved data blocks to provide the single resultant data stream. Examples of how the data values of the first and second types can be interleaved will be provided later.

An encoding method in which the data values of the first type (A) and the data values of the second type (B) are provided as interleaved pairs (A, B) is hereinafter referred to as "Mode Run-Length Encoding (MRLE)".

Moreover, it is to be noted here that in the planar format, all the data values of the first type are inserted into the single resultant data stream, followed by all the data values of the second type, or vice versa.

Moreover, optionally, the encoder is configured to employ at least one entropy encoding method to compress the one or more data streams either together or separately. Optionally, in this regard, the at least one entropy encoding method includes at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, TrueBits Copy coding. These at least one encoding method are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

Moreover, optionally, the at least one entropy encoding method may use Pedestal, MaxIndex, or Look-Up Table (LUT) solutions to minimize the range of the data values and/or the amount of alternatives for the symbols about to be signalled. These methods are, for example, described in greater detail in databases such as Wikipedia (accessible via TCP/IP Internet), and also in published patent documents having Gurulogic Microsystems Oy named as applicant (assessable via Espacenet at the European Patent Office, wherein Ossi Kalevo is named as inventor).

Optionally, the information indicative of the count of the non-mode symbols is delivered before the one or more data streams in the encoded data (E2).

According to an embodiment, the encoder is configured to deliver the encoded data (E2) to at least one decoder. As an example, the encoded data (E2) is written to a file by the encoder, and is then read from the file by the at least one decoder. As another example, the encoded data (E2) is streamed from the encoder to the at least one decoder.

Optionally, the encoder is configured to assemble or encode additional information relating to delivery of at least one of: probability and index tables, mode symbols, counts of mode symbols, indices of selected encoding methods, data values, maximum indices of different data.

Optionally, in this regard, the encoder is configured to deliver, to at least one decoder, an index that is indicative of at least one of: a selected encoding method, the at least one mode symbol, the count of mode symbols, whether or not the at least one mode symbol is communicated in the encoded data (E2).

Optionally, the encoder is configured to deliver the aforesaid additional information as prior information before delivery of the encoded data (E2). Alternatively, optionally, the encoder is configured to deliver the additional information together with the encoded data (E2) as a part of the encoded data (E2).

Moreover, when the index that is provided to the at least one decoder includes information about selecting an encoding method employed by the encoder (namely, a selection made by the encoder, for example), for example, such as a Mode RLE (MRLE) or a Split mode RLE (SMRLE) method, the index can be referred to as a method selection index. An example of such a method selection index is 'SMRLE2_X1_X2', wherein a number '2' in the index indicates that there are two mode symbols in the encoded data (E2), and each symbol 'Xn' in the index indicates that the mode symbols (n=1, 2, . . . N) are delivered within the encoded data (E2). As another example, when a count of mode symbols is delivered within the encoded data (E2), a method selection index 'SMRLEN' can be used, wherein the symbol 'N' indicates that the count of mode symbols and the mode symbols are delivered within the encoded data (E2). As yet another example, when the mode symbols are not delivered within the encoded data (E2), a method selection index 'SMRLE2_H_F' can be used, wherein symbols 'H' and 'F' represent mode symbols that are used. As still another example, when one mode symbol is used and is delivered within the encoded data (E2), a method selection index 'SMRLE1_X1' can be used.

In this manner, the at least one mode symbol and the count of mode symbols are delivered to the at least one decoder either via the aforesaid index. It will be appreciated that in the index, the information about the selected method can be inserted before, after or in between the at least one mode symbol and the count of mode symbols. Moreover, optionally, the aforesaid index can be used to indicate whether or not a first symbol, a last symbol or both the first and last symbols in the input data (D1) are non-mode symbols. As an example, a method selection index 'SMRLE1_X1_First' indicates that the first symbol in the input data (D1) is a non-mode symbol, while a method selection index 'SMRLE1_X1_Last' indicates that the last symbol in the input data (D1) is a non-mode symbol. Likewise, a method selection index 'SMRLE1_X1_FirstAndLast' indicates that both of the first and last symbols in the input data (D1) are non-mode symbols.

With regard to the aforesaid additional information, delivery of the probability tables and indices has been described in detail in the granted United Kingdom patent GB2523348.

Optionally, the additional information relating to delivery of the mode symbols and the counts of different mode symbols is indicative of how many recursive mode symbols are used, in a case where multiple mode symbols are used.

Optionally, in a case where multiple mode symbols are used, the information that is indicative of the at least one mode symbol includes for example only a first mode symbol, while the additional information includes information of other mode symbol(s).

Optionally, the count of the non-mode symbols is also indicated by the index.

According to an embodiment, the encoder is configured to dynamically select, from amongst a plurality of encoding algorithms, an encoding algorithm to be employed in (a) to (d), depending upon one or more properties of the input data (D1), to obtain an improved degree of data compression in the encoded data (E2).

In this regard, optionally, a most efficient encoding algorithm is selected in a dynamically changing manner, as a nature or content of the input data (D1) to be encoded varies; "nature" in such case refers to a structure of the input data (D1), for example a spectrum of value distributions within the input data (D1), localized concentrations of certain numerical values within the input data (D1), patterns of data repetition within the input data (D1), but not limited thereto. As mentioned earlier, examples of the input data (D1) include, but are not limited to, binary data, text data, audio data, image data, video data, measurement data, sensor data, biometric data, biological genetic data, genome data, transform coefficient data, transformed data, processed data, partial data. Optionally, the selection of the most efficient encoding algorithm is performed by:

(i) compressing the input data (D1) with different encoding algorithms;
(ii) computing an entropy of compressed data obtained with each of the different encoding algorithms;
(iii) computing or estimating, for each of the different encoding algorithms, an amount of data required for delivery of the aforementioned additional information relating to at least one of: probability and index tables, mode symbols, counts of mode symbols, indices of selected methods, data values, maximum indices of different data; and
(iv) comparing the different encoding algorithms with respect to the entropy of the compressed data and/or the amount of data required for delivery of the additional information.

The steps (i) and (ii) could be replaced also by entropy-coding the different types of data already before method selection. This approach would require more processing resources, but on the other hand, it certainly offers a better selection, since it is based on the actual data size.

As an example, some portions of the input data (D1) can be compressed by range coding those portions of the input data (D1) directly, if delivery of a range table can be executed efficiently. Correspondingly, the encoded data (E2) can also be entropy-compressed using various different entropy-coding methods (namely variously mutually different entropy-coding methods), because the encoding algorithm selection process will also take into account the additional advantages yielded to different data values by entropy compression in steps (ii) and (iii). This applies both to values that were coded in one or more streams, and also to such values that were not coded.

According to an embodiment, the encoder is configured to employ additional encoding methods for encoding one or more portions of the input data (D1), wherein the additional methods include at least one of: Delta encoding, ODelta encoding, Run Length Encoding (RLE), Split RLE (SRLE), ZRLE, MRLE encoding, SMRLE encoding, Huffman coding, Variable-Length Code (VLC) encoding, Range coding, Arithmetic coding, Entropy Modifying (EM) encoding, Continuum operator encoding, TrueBits Copy coding. Herein, the term "Delta encoding" refers to a method of storing or transmitting data in a form of differences between sequential data rather than complete data files, while the term "ODelta" refers to a differential form of encoding based upon wraparound in a binary counting regime, for example as described in the patent document GB 1412937.3. RLE, SRLE and ZRLE can be employed, for example, as described in references [1], [2] and [3], respectively. It is to be noted that MRLE and SMRLE coding methods are listed, because of the recursion. It is often the most efficient to perform the recursion in such a way that those sequences of data that are either first values or second values are fed as new input to exactly the same coding system in an entropy-coding block. The entropy-coding block then selects either one of the MRLE/SMRLE methods recursively or else selects, for example, Range coding. The Continuum operator encoding can be employed, for example as described in reference [4]. It will be appreciated that the runs of the at least one mode symbol may sometimes be a very large number, and therefore, an escape value can be used to represent such a large number, for example, by employing the Continuum operator or some other escape value solution. Using an escape value makes it possible to use several symbols for signalling one large data value, without needing to have an unreasonably large value range for expressing the data values. The EM encoding can be employed, for example, as described in reference [5]. Herein, the Copy coding can refer to either direct copying or a so-called "true bits" type copying. In other words, for example if the data is originally 8-bit values, but the value range of the data could be represented with 5 bits, then the symbols are signaled with the "true bits" type Copy method as 5-bit symbols instead of 8-bit symbols. It is to be appreciated that the TrueBitsCopy method signals the data values by using the smallest possible value range in such a way that an eventual pedestal value can be omitted and signaled, and the MaxIndex value and the necessary bit depth can also be signaled. It is also possible to use the LUTCopy method, where at first the values that occur in the data are signaled as a Look-Up-Table, and then the data in question is coded by utilizing the indices of the LUT. 'TrueBitsCopy' is a trademark.

As an example, a method selection index 'ODeltaSMRLE1_X1Coded' indicates that the input data (D1) is first ODelta-coded, then encoded using one or more encoding methods pursuant to embodiments of the present disclosure; in this example, SMRLE, with one delivered mode symbol, is employed to generate the mode symbol and first and second data streams, and then the first and the second data streams are encoded using one or more predefined (or selected with delivery of selection) entropy encoding methods, such as Delta encoding, ODelta encoding, Run Length Encoding (RLE), Split RLE (SRLE), ZRLE, MRLE encoding, SMRLE encoding, Huffman coding, Variable-Length Code (VLC) encoding, Range coding, Arithmetic coding, Entropy Modifying (EM) encoding, Continuum operator encoding, TrueBits Copy coding. Encoded data (E2) generated in such a manner is decoded at the at least one decoder in a reverse order of processing steps to an order of processing steps employed during encoding of the input data (D1) to generate the encoded data (E2); such reverse order is employed when transcoding is not required in the at least one decoder.

Furthermore, optionally, the aforementioned encoder is useable with other known encoders; for example, in conjunction with a block encoder as described in reference [6].

For illustration purposes only, there will next be considered some examples of how the aforementioned encoder can be implemented pursuant to embodiments of the present disclosure. There will now be considered a portion of an input data stream (D1) that includes 38 symbols (alphanumeric characters), represented as follows:
FHFFFJFFFFHFFFFHFHFFFIFFFFFFHFHIFFFFHF In the portion of the input data stream (D1), counts of different symbols are as follows:
F (28), H (7), I (2), J (1)

As the count of the symbol 'F' is higher than the counts of other symbols, the symbol 'F' is determined to be a mode symbol in the input data stream (D1).

It will be appreciated that the "counts" mentioned here are actually values in a probability table. Since in this example, only a few different symbols occur, then it is potentially advantageous to deliver an index table for the symbols and their probabilities, or rather frequencies of occurrence thereof (namely "counts") than to deliver the entire probability table. In this example, most of other possible different symbols have a zero frequency of occurrence. Thus, indices of the symbols 'F', 'H', 'I', and 'J' are, for example, delivered one after the other, namely as an index table. As an example, the symbols F, H, I, and '3' can correspond in coding to the indices 0, 1, 2 and '3', respectively, after which their probabilities '28', '7', '2' and '1', namely the probability table, is optionally sent.

In the example here, on account of the symbols of the input data (D1) being alphanumeric characters, and not integers, the index of 'F' is optionally calculated, for example, as follows:

$$\text{index } (F) = \text{ascii code } (F) - \text{ascii code } (A),$$

namely 70−65=5.

It will also be appreciated that, as the input data (D1) is encoded with the aforementioned MRLE/SMRLE method, there is an option of selecting whether used mode symbols are sent as separate values or are obtained directly from sent probability tables and index tables. If the used mode symbols are sent as separate values, then they are optionally no longer sent in connection with the sent tables. If the used mode symbols are obtained directly from the sent probability tables and index tables, then there is no requirement for the used mode symbols to be sent separately any more.

In accordance with an embodiment of the present disclosure, the encoder is configured to deliver the mode symbol, a non-mode stream, namely a first stream that includes non-mode symbols as they occur in the portion of the input data stream (D1), and a runs stream, namely a second stream that includes runs of the mode symbol occurring before each of the non-mode symbols.

Thus, the non-mode stream (namely, the first stream) can be represented as follows:
HJHHHIHHIH
while the runs stream (namely, the second stream) can be represented as follows:
1, 3, 4, 4, 1, 3, 6, 1, 0, 4, (1)

In the illustrated example, there is one occurrence of the mode symbol (hereinafter referred to as 'the last run of the mode symbol') after the last non-mode symbol in the portion of the input data stream (D1). Optionally, the last run of the mode symbol after the last non-mode symbol can be described by delivering a total count of symbols, which is 38 in the illustrated example. Alternatively, optionally, the last run of the mode symbol after the last non-mode symbol can be described by adding a value of '1' to an end of the runs stream, as shown in brackets above.

When the value of '1' is not added, the count of the runs of the mode symbol in the runs stream is the same as the count of the non-mode symbols in the non-mode stream, which is 10 in the illustrated example. In such a case, delivering the total count of symbols with encoded data (E2) enables determination of the last run of the mode symbol after the last non-mode symbol during subsequent decoding of the encoded data (E2).

On the other hand, when the value of '1' is added, the count of the runs of the mode symbol in the runs stream is one more than the count of the non-mode symbols in the non-mode stream. This is indicative of a presence of the last run of the mode symbol after the last non-mode symbol.

Optionally, a continuum operator, for example as described in reference [4], can be employed by the encoder pursuant to embodiments of the present disclosure. If the continuum operator is employed, the count of the runs of the mode symbol can be increased, as the count of the non-mode symbols in the non-mode stream remains the same. The original runs of the mode symbol are later obtained after decoding the continuum operator at a given decoder.

In the aforementioned example, the delivery is for "information that is indicative of the count of the non-mode symbols", instead of the delivery of "the count of the non-mode symbols". However, it will be appreciated that embodiments of the present invention encompass both approaches when coding to generate the encoded data (E2).

In a first example, the mode symbol, the non-mode stream (namely, the first stream) and the runs stream (namely, the second stream) can be delivered as interleaved data blocks one after another, as represented below:

F, 10, H, J, H, H, H, I, H, H, I, H, 1, 3, 4, 4, 1, 3, 6, 1, 0, 4, 1

Hereinabove, a first symbol 'F' indicates the mode symbol, and a second symbol '10' indicates the count of the non-mode symbols. Delivering the count of the non-mode symbols enables the given decoder to decode the encoded data (E2) properly, by using the count of the non-mode symbols as a limiter of a counter in a decoding loop employed in the given decoder. As aforementioned, it will be appreciated that the delivery of the count of the non-mode symbols can also be replaced by delivering the total count of symbols, and still the given decoder is able to operate correctly, without having been delivered a particular value of the count of the non-mode symbols, because the given decoder received other relevant values and obtained, from the received values, information it needed, namely the count of the non-mode symbols. Thus, the information about the "count" is optionally obtained in other ways than via only delivering that particular value.

It will be appreciated that embodiments of the present disclosure enable delivery of the information about this "count", in such a way that the given decoder is able to finish at a correct place. Optionally, it is irrelevant which "count", or a combination of "counts", is delivered, as long as the limiter of the counter for the decoding loop employed in the given decoder can be computed correctly.

Moreover, the runs of the mode symbol are delivered after the last non-mode symbol. Therefore, the total count of symbols is not required to be delivered. If the total count of symbols is required to be known, it can be calculated from the count of the non-mode symbols and the runs of the mode symbol, namely by summing them all together. It will be appreciated that any of the two counts, namely the total count of symbols and the count of the non-mode symbols, can be calculated, if the other is known. Alternatively, optionally, as a minimum requirement, one of these two counts is known and the first and the second streams are split for purposes of decoding, for example with the help of interleaving, in such a way that the decoding can be completed with the help of the known count.

In the first example, a method selection index 'SMRLE1_X1' is delivered from the encoder to the given decoder. The method selection index 'SMRLE1_X1' indicates that there is one mode symbol, and the mode symbol has been provided in the encoded data (E2).

In the aforementioned first example, only 23 symbols are required to be delivered from the encoder to the given decoder.

In a second example, the non-mode symbols and the runs of the mode symbol occurring before, after and between the non-mode symbols can be delivered as represented below:

F, 10, 1, H, 3, J, 4, H, 4, H, 1, H, 3, I, 6, H, 1, H, 0, I, 4, H, 1

The non-mode symbols and the runs of the mode symbol are interleaved in the above manner, for example, when it is not beneficial to compress the non-mode stream and the runs stream separately.

The encoded data (E2) as delivered in the second example is relatively easy to understand and to decode. As earlier, a first symbol 'F' indicates the mode symbol, and a second symbol '10' indicates the count of the non-mode symbols. During decoding, all the runs of the mode symbol (namely, numbers) are replaced with a similar number of occurrences of the mode symbol. Consequently, decoded data (D3) is then provided as follows:
FHFFFJFFFFHFFFFHFHFFFIFFFFFFHFHIFFFFHF Furthermore, in the above example, it can be seen that the non-mode stream includes multiple repetitions of the symbol 'H'. Optionally, in this regard, a recursive processing of the non-mode stream can be performed pursuant to (a) to (d) to deliver another stream, which can be represented as follows:
H, 3, 1, J, 3, I, 2, I, 1

Hereinabove, a symbol 'H' indicates a second mode symbol, and a symbol '3' indicates the count of remaining non-mode symbols. Thereafter, the remaining non-mode symbols and runs of the second mode symbol occurring before, after and between the remaining non-mode symbols are delivered as shown above.

In a third example, the entire encoded data (E2) can be delivered as follows:
H, F, 3, 10, J, I, I, 1, 3, 2, 1, 1, 3, 4, 4, 1, 3, 6, 1, 0, 4, 1

In the third example, a method selection index 'SMRLE2_X1_X2' is delivered from the encoder to the given decoder. The method selection index 'SMRLE2_X1_X2' indicates that there are two mode symbols (namely, the symbols 'H' and 'F'), and these mode symbols have been provided in the encoded data (E2).

In a fourth example, the count of the mode symbols can be delivered within the encoded data (E2), which can be represented as follows:
2, H, F, 3, 10, 3, I, I, 1, 3, 2, 1, 1, 3, 4, 4, 1, 3, 6, 1, 0, 4, 1

In the fourth example, a method selection index 'SMRLEN' is delivered from the encoder to the given decoder. The method selection index 'SMRLEN' indicates that the mode symbols and the count of the mode symbols have been provided in the encoded data (E2).

In a fifth example, the mode symbols and the count of the mode symbols are not delivered within the encoded data (E2), which can be represented as follows:
3, 10, 3, I, I, 1, 3, 2, 1, 1, 3, 4, 4, 1, 3, 6, 1, 0, 4, 1

In the fifth example, a method selection index 'SMRLE2_H_F' is delivered from the encoder to the given decoder. The method selection index 'SMRLE2_H_F' indicates that there are two mode symbols, namely the mode symbols 'H' and 'F'.

Furthermore, optionally, the streams of runs for all mode symbols can be combined and compressed together.

In a sixth example, a combined runs stream can be represented as follows:
1, 3, 2, 1, 1, 3, 4, 4, 1, 3, 6, 1, 0, 4, 1

In the combined runs stream, counts of different run symbols are as follows:
0 (1), 1 (6), 2 (1), 3 (3), 4 (3), 6 (1)

As an example, the combined runs stream can be compressed by using range coding or Huffman coding methods.

For illustration purposes only, there will next be considered another example of how the aforementioned encoder can be implemented pursuant to embodiments of the present disclosure. There will now be considered a portion of an input data stream that includes 12 symbols (numeric characters), represented as follows:
2, 2, 3, 0, 2, 2, 2, 0, 2, 2, 1, 4

Correspondingly, encoded data (E2) delivered by the encoder pursuant to embodiments of the present disclosure can be represented as follows:
2, 5, 3, 0, 0, 1, 4, 2, 0, 3, 2, 0

Hereinabove, a first symbol '2' indicates a mode symbol, a second symbol '5' indicates the count of non-mode symbols. The second symbol '5' is followed by a non-mode stream, which is followed by a runs stream.

In the illustrated example, the original non-mode stream cannot include a value of '2', namely a mode value of '2'.

Therefore, optionally, all values greater than '2' are decreased by one to generate a modified non-mode stream. This can be implemented either during encoding or after encoding, before compression.

As a result, a maximum index for the non-mode stream decreases from '4' to '3', and the modified non-mode stream is represented as follows:

2, 0, 0, 1, 3

During subsequent decoding, a given decoder recovers the original non-mode stream from the modified non-mode stream, by increasing all values equal to or greater than the mode value '2' by one. It will be appreciated that this recovering can be implemented before decoding or in connection with decoding.

For the sake of simplicity and clarity, the examples have been provided for a case where there is a single mode symbol in the input data (D1). However, it is to be noted here that embodiments of the present disclosure can be implemented in a similar manner for a case where there are more than one mode symbol in the input data (D1).

In a second aspect, embodiments of the present disclosure provide a method of encoding input data (D1) to generate corresponding encoded data (E2), characterized in that the method includes:

(a) analyzing the input data (D1) to identify at least one mode symbol therein;
(b) generating data values of at least a first type and a second type, wherein the data values of the first type include non-mode symbols, and the data values of the second type include runs of the at least one mode symbol, wherein the runs of the at least one mode symbol are indicative of occurrences of the at least one mode symbol before or after the non-mode symbols within the input data (D1);
(c) generating information that is indicative of a count of the non-mode symbols and information that is indicative of the at least one mode symbol; and
(d) assembling or encoding the information that is indicative of the at least one mode symbol, the information that is indicative of the count of the non-mode symbols, the data values of the first type including the non-mode symbols and the data values of the second type including the runs of the at least one mode symbol, to generate the encoded data (E2).

According to an embodiment, the method includes generating symbols in the input data (D1) prior to (a) to (d) by splitting or combining original symbols present in the input data (D1). Optionally, in this regard, the method includes:

(i) splitting at least one or more portions of the input data (D1) to generate one or more new symbols for processing pursuant to (a) to (d); and/or
(ii) combining one or more alphanumeric characters of at least one or more portions of the input data (D1) to generate new combined symbols for processing pursuant to (a) to (d).

Optionally, the method includes inserting the data values of the first type and the data values of the second type into one or more data streams, prior to step (d).

According to an embodiment of the present disclosure, when inserting into the one or more data streams, the method includes inserting the data values of the first type and the data values of the second type into separate data streams. Optionally, in this regard, the data values of the first type and the data values of the second type are inserted into a first data stream and a second data stream, respectively.

According to an embodiment, the method is susceptible to being used recursively. Optionally, in this regard, the method includes recursively processing the first data stream including the non-mode symbols pursuant to (a) to (d).

According to another embodiment of the present disclosure, when inserting into the one or more data streams, the method includes inserting the data values of the first type and the data values of the second type in an interleaved format or a planar format into a single data stream.

Alternatively, optionally, when the data values of the first type and the data values of the second type are inserted into the first and second data streams, the method includes combining the first and second data streams to form a single resultant data stream either in the interleaved format or in the planar format.

According to an embodiment, the method includes interleaving the data values of the first and second types to provide the single resultant data stream. According to another embodiment, the method includes interleaving the data values of the first and second types as interleaved data blocks to provide the single resultant data stream.

Moreover, optionally, the method includes employing at least one entropy encoding method to compress the one or more data streams either together or separately. It is also possible to select an option of not entropy-coding one of the two streams, for example only one of the streams will be entropy-coded and the other of the streams is not entropy-coded. Optionally, in this regard, the at least one entropy encoding method includes at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, TrueBits Copy coding.

According to an embodiment, the method includes delivering the encoded data (E2) to at least one decoder. As an example, the encoded data (E2) is written to a file by a given encoder, and is then read from the file by the at least one decoder. As another example, the encoded data (E2) is streamed from the given encoder to the at least one decoder.

According to an embodiment, the method includes assembling or encoding additional information relating to delivery of at least one of: probability and index tables, mode symbols, counts of mode symbols, indices of selected encoding methods, data values, maximum indices of different data.

Optionally, in this regard, the method includes delivering, to at least one decoder, an index that is indicative of at least one of: a selected encoding method, the at least one mode symbol, the count of mode symbols, whether or not the at least one mode symbol is communicated in the encoded data (E2).

Optionally, the method includes delivering the aforesaid additional information as prior information before delivery of the encoded data (E2). Alternatively, optionally, the method includes delivering the additional information together with the encoded data (E2) as a part of the encoded data (E2).

According to an embodiment, the method includes dynamically selecting, from amongst a plurality of encoding algorithms, an encoding algorithm to be employed in (a) to (d), depending upon one or more properties of the input data (D1), to obtain an improved degree of data compression in the encoded data (E2).

According to an embodiment, the method includes employing additional encoding methods for encoding one or more portions of the input data (D1), wherein the additional methods include at least one of: Delta encoding, ODelta encoding, RLE, SRLE, ZRLE, MRLE, SMRLE, Huffman coding, VLC coding, Range coding, Arithmetic coding, EM encoding, Continuum operator encoding, TrueBits Copy coding. These additional methods are elucidated in greater detail in the foregoing.

In a third aspect, embodiments of the present disclosure provide a decoder for decoding encoded data (E2) to generate corresponding decoded data (D3), characterized in that:

(i) the decoder is configured to decode from the encoded data (E2) information that is indicative of at least one mode symbol, information that is indicative of a count of non-mode symbols, data values of at least a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data (D1); and (ii) the decoder is configured to insert before or after the non-mode symbols corresponding runs of the at least one mode symbol to generate the decoded data (D3).

Optionally, the decoder is configured to receive within the encoded data (E2) one or more data streams including the data values of the first type and the data values of the second type.

According to an embodiment of the present disclosure, the data values of the first type and the data values of the second type are received in separate data streams.

According to another embodiment of the present disclosure, the data values of the first type and the data values of the second type are received in an interleaved format or a planar format in a single data stream.

Optionally, the decoder is configured to employ an inverse of at least one entropy encoding method employed to compress the one or more data streams either together or separately at a corresponding encoder.

Optionally, when more than one mode symbol are employed in the encoded data (E2), the decoder is configured to recursively process (i) to (ii) for each mode symbol to generate the decoded data (D3).

According to an embodiment, the decoder is configured to receive additional information relating to at least one of: probability and index tables, mode symbols, counts of mode symbols, indices of selected encoding methods, data values, maximum indices of different data. Optionally, in this regard, the decoder is configured to use the additional information for proper decoding of the encoded data (E2).

Optionally, in this regard, the decoder is configured to receive, from a corresponding encoder, an index that is indicative of at least one of: a selected encoding method, the at least one mode symbol, the count of mode symbols, whether or not the at least one mode symbol is communicated in the encoded data (E2).

Optionally, the decoder is configured to receive the aforesaid additional information as prior information before receipt of the encoded data (E2). Alternatively, optionally, the decoder is configured to receive the additional information together with the encoded data (E2) as a part of the encoded data (E2).

Optionally, when the encoded data (E2) has been encoded using additional encoding methods, the decoder is configured to decode the encoded data (E2) in a reverse order of processing steps to an order of processing steps employed during encoding of original input data (D1) to generate the encoded data (E2) by a corresponding encoder. In this regard, optionally, the decoder is configured to employ additional decoding methods, wherein the additional decoding methods include at least one of: Delta decoding, ODelta decoding, RLE decoding, SRLE decoding, ZRLE decoding, MRLE decoding, SMRLE decoding, Huffman decoding, VLC decoding, Range decoding, Arithmetic decoding, Entropy Modifying (EM) decoding, Continuum operator decoding, TrueBits Copy decoding. Thus, the decoding methods are inverse methods of the coding methods used in the encoder; however, when transcoding is implemented in the decoder, additional or alternative methods are employed in the decoder, such that the data D1, D3 are then mutually different but often include substantially similar content; for example, the decoder is implemented on a mobile wireless device, and applies to transcoding to reformat video content present in the input data (D1), and encoded into the encoded data (E2), so that the content can be presented in an appropriate manner on a miniature pixel display of the mobile wireless device. These additional, or alternative methods are, for example, elucidated in greater detail in the foregoing.

Furthermore, optionally, the aforementioned decoder is useable with other known decoders; for example, in conjunction with a block decoder as described in reference [7].

In a fourth aspect, embodiments of the present disclosure provide a method of decoding encoded data (E2) to generate corresponding decoded data (D3), characterized in that the method includes:

(i) decoding from the encoded data (E2) information that is indicative of at least one mode symbol, information that is indicative of a count of non-mode symbols, data values of at least a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data (D1); and (ii) inserting before or after the non-mode symbols corresponding runs of the at least one mode symbol to generate the decoded data (D3).

Optionally, the method includes receiving within the encoded data (E2) one or more data streams including the data values of the first type and the data values of the second type.

According to an embodiment of the present disclosure, the data values of the first type and the data values of the second type are received in separate data streams.

According to another embodiment of the present disclosure, the data values of the first type and the data values of the second type are received in an interleaved format or a planar format in a single data stream.

Optionally, the method includes employing an inverse of at least one entropy encoding method employed to compress the one or more data streams either together or separately at a corresponding encoder.

Optionally, when more than one mode symbol are employed in the encoded data (E2), the method includes recursively processing (i) to (ii) for each mode symbol to generate the decoded data (D3).

According to an embodiment, the method includes receiving additional information relating to at least one of: probability and index tables, mode symbols, counts of mode symbols, indices of selected encoding methods, data values, maximum indices of different data. Optionally, in this regard, the method includes using the additional information for proper decoding of the encoded data (E2).

Optionally, in this regard, the method includes receiving, from a corresponding encoder, an index that is indicative of at least one of: a selected encoding method, the at least one mode symbol, the count of mode symbols, whether or not the at least one mode symbol is communicated in the encoded data (E2).

Optionally, the method includes receiving the aforesaid additional information as prior information before receipt of the encoded data (E2). Alternatively, optionally, the method includes receiving the additional information together with the encoded data (E2) as a part of the encoded data (E2).

Optionally, when the encoded data (E2) has been encoded using additional encoding methods, the method includes decoding the encoded data (E2) in a reverse order of processing steps to an order of processing steps employed during encoding of original input data (D1) to generate the encoded data (E2) by a corresponding encoder. In this regard, optionally, the method includes employing additional decoding methods, wherein the additional decoding methods include at least one of: Delta decoding, ODelta decoding, RLE decoding, SRLE decoding, ZRLE decoding, MRLE decoding, SMRLE decoding, Huffman decoding, VLC decoding, Range decoding, Arithmetic decoding, Entropy Modifying (EM) decoding, Continuum operator decoding, TrueBits Copy decoding. Such additional decoding methods are described in documents mentioned in the foregoing, and also in the references. (Moreover, such methods are also described in databases such as TCP/IP Internet database Wikipedia, and also in various published patent documents having Gurulogic Microsystems Oy named as applicant and Ossi Kalevo named as inventor).

In a fifth aspect, embodiments of the present disclosure provide a codec including at least one encoder for encoding input data (D1) to generate corresponding encoded data (E2) pursuant to the aforementioned first aspect, and at least one decoder for decoding the encoded data (E2) to generate corresponding decoded data (D3) pursuant to the aforementioned third aspect.

An example codec has been provided in conjunction with FIG. 1 as explained in more detail below. The codec includes at least one encoder 110 for encoding input data (D1) to generate corresponding encoded data (E2), and at least one decoder 120 for decoding the encoded data (E2) to generate corresponding decoded data (D3). The encoder 110 includes an MRLE/SMRLE encoder 111, which is used for encoding the input data (D1) pursuant to embodiments of the present disclosure. The encoder 110 optionally includes an entropy encoder 112, which is used for entropy compression of the encoded data (E2) to generate entropy-compressed encoded data (E3). The decoder 120 includes an MRLE/SMRLE decoder 121, which is used for decoding the encoded data (E2). The decoder 120 optionally includes an entropy decoder 122 for entropy decompression of the entropy-compressed encoded data (E3) to generate the encoded data (E2). Collectively, the at least one encoder 110 and the at least one decoder 120 constitute a codec 130.

The input data (D1), or a part thereof, can be encoded with the MRLE/SMRLE encoder 111, or with another encoding method. The encoded data (E2) can optionally be entropy-compressed with the entropy encoder 112, or with another entropy compressor.

The encoded data (E2) can be decoded with the MRLE/SMRLE decoder 121, if it was encoded with the MRLE/SMRLE encoder 111, or with an inverse counterpart to the encoding method that was used. If the encoded data (E2) was optionally entropy-compressed into the entropy-compressed encoded data (E3), then it is entropy-decompressed back to the encoded data (E2) before decoding, using an inverse counterpart of the entropy encoding method that was used by the entropy encoder 112. When entropy coding is optionally used on one or more data sections or on the values of one or more data sections, then information about the used method and all the data that the method requires for enabling correct decoding need to be inserted into the encoded data.

Optionally, the decoded data (D3) is identical with, namely identical to, the input data (D1), as in a lossless mode of operation. Alternatively, optionally, the decoded data (D3) is approximately similar to the input data (D1), as in a lossy mode of operation. Yet alternatively, optionally, the decoded data (D3) is different to the input data (D1), for example by way of a transformation, for example transcoding, but retains substantially similar information present in the input data (D1); for example, the decoded data (D3) is usefully made different to the input data (D1) when reformatting of the decoded data (D3) is also required, for example to be compatible with different types of communication platforms, software layers, communication devices, display devices, and so forth.

The at least one encoder includes a data processing arrangement for processing the input data (D1) to generate the corresponding encoded data (E2) pursuant to embodiments of the present disclosure. Optionally, the data processing arrangement of the at least one encoder is implemented by employing at least one Reduced Instruction Set Computing (RISC) processor that is configured to execute program instructions as elucidated earlier.

Furthermore, optionally, the at least one encoder 110 is configured to communicate the encoded data (E2) to a data server and/or data storage for storing in a database. The data server and/or data storage is arranged to be accessible to the at least one decoder 120, which is beneficially compatible with the at least one encoder 110, for subsequently decoding the encoded data (E2).

In some examples, the at least one decoder is optionally configured to access the encoded data (E2) from the data server and/or data storage.

In alternative examples, the at least one encoder 110 is optionally configured to stream the encoded data (E2) to the at least one decoder 120, either via a communication network or via a direct connection. Moreover, it is to be noted that a device equipped with a hardware-based or software-based encoder can also communicate directly with another device equipped with a hardware-based or software-based decoder.

In yet other alternative examples, the at least one decoder 120 is optionally implemented so as to retrieve the encoded data (E2) from a non-transitory (namely non-transient) computer-readable storage medium, such as a hard drive and a Solid-State Drive (SSD).

The at least one decoder 120 includes a data processing arrangement for processing the encoded data (E2) to generate the corresponding decoded data (D3) pursuant to embodiments of the present disclosure. Optionally, the data processing arrangement of the at least one decoder 120 is implemented by employing at least one RISC processor that is configured to execute program instructions as elucidated earlier; such a RISC processor is capable of performing relatively simpler concatenated operations at a very high speed, and is suitable for decoding data provided in a streamed format, for example in real-time.

When embodiments of the present disclosure are implemented in a multicasting manner, there is a plurality of such decoders that are employed.

Optionally, the codec 130 is implemented within a single device. Alternatively, optionally, the codec 130 is effectively implemented between multiple devices. Optionally, the codec 130 is implemented as custom-design digital hardware, for example via use of one or more Application-Specific Integrated Circuits (ASIC's). Alternatively or additionally, optionally, the codec 130 is implemented using computing hardware that is configured to execute program instructions, for example provided to the computing hardware on a non-transient (non-transitory) machine-readable data carrier.

As an example, the at least one encoder 110 and/or the at least one decoder 120 can be beneficially employed in consumer electronics apparatus, wireless communication apparatus and associated systems, digital cameras, smart phones, tablet computers, personal computers, scientific measuring apparatus, communications equipment, video-conferencing equipment, satellites, but not limited thereto.

In a sixth aspect, embodiments of the present disclosure provide a computer program product comprising a non-transitory computer-readable storage medium having computer-readable instructions stored thereon, the computer-readable instructions being executable by a computerized device comprising processing hardware to execute any of the aforementioned methods pursuant to the aforementioned second or fourth aspects.

Optionally, the computer-readable instructions are downloadable from a software application store, for example, from an "App store" to the computerized device.

Next, embodiments of the present disclosure will be described with reference to figures.

Referring to FIG. 1, embodiments of the present disclosure concern:
(i) an encoder 110 for encoding input data (D1) to generate corresponding encoded data (E2), and corresponding methods of encoding the input data (D1) to generate the encoded data (E2);
(ii) a decoder 120 for decoding the encoded data (E2) to generate corresponding decoded data (D3), and corresponding methods of decoding the encoded data (E2) to generate the decoded data (D3); and
(iii) a codec 130 including a combination of at least one encoder and at least one decoder, for example a combination of the encoder 110 and the decoder 120.

The encoder 110 includes an MRLE/SMRLE encoder 111, while the decoder 120 includes an MRLE/SMRLE decoder 121. Optionally, the encoder 110 includes an entropy encoder 112 for reducing the entropy of the encoded data (E2) to generate entropy-compressed encoded data (E3), while the decoder 120 includes an entropy decoder 122 for decompressing the entropy-compressed encoded data (E3) back to the encoded data (E2).

FIG. 1 is merely an example, which does not unduly limit the scope of the claims herein. It is to be understood that the specific designation for the codec 130 is provided as an example and is not to be construed as limiting the codec 130 to specific numbers, types, or arrangements of encoders and decoders. A person skilled in the art will recognize many variations, alternatives, and modifications of embodiments of the present disclosure.

Figure 2:
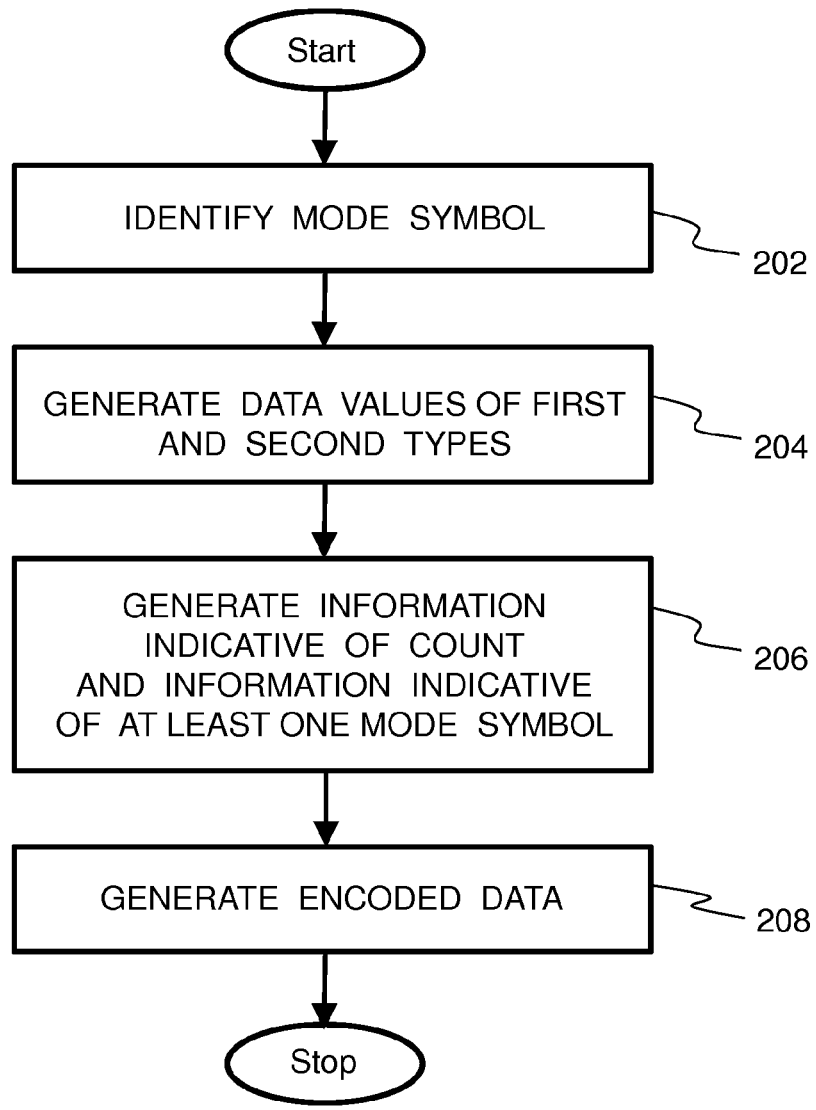
FIG. 2 is a schematic illustration of a flow chart depicting steps of a method of encoding input data (D1) to generate corresponding encoded data (E2), in accordance with an embodiment of the present disclosure.

Referring now to FIG. 2, there is provided a flow chart depicting steps of a method of encoding input data (D1) to generate corresponding encoded data (E2), in accordance with an embodiment of the present disclosure. The method is depicted as a collection of steps in a logical flow diagram, which represents a sequence of steps that can be implemented in hardware, software, or a combination thereof, for example as aforementioned.

At a step 202, the input data (D1) is analyzed to identify at least one mode symbol therein.

At a step 204, data values of at least a first type and a second type are generated, wherein the data values of the first type include non-mode symbols, and the data values of the second type include runs of the at least one mode symbol. The runs of the at least one mode symbol are indicative of occurrences of the at least one mode symbol before or after the non-mode symbols within the input data (D1).

At a step 206, information that is indicative of a count of the non-mode symbols and information that is indicative of the at least one mode symbol are generated.

At a step 208, the information that is indicative of the at least one mode symbol generated at the step 206, the information that is indicative of the count of the non-mode symbols generated at the step 206, and the data values of the first and second types generated at the step 204 are encoded to generate the encoded data (E2).

The steps 202 to 208 are only illustrative and other alternatives can also be provided where one or more steps are added, one or more steps are removed, or one or more steps are provided in a different sequence without departing from the scope of the claims herein.

Figure 3:
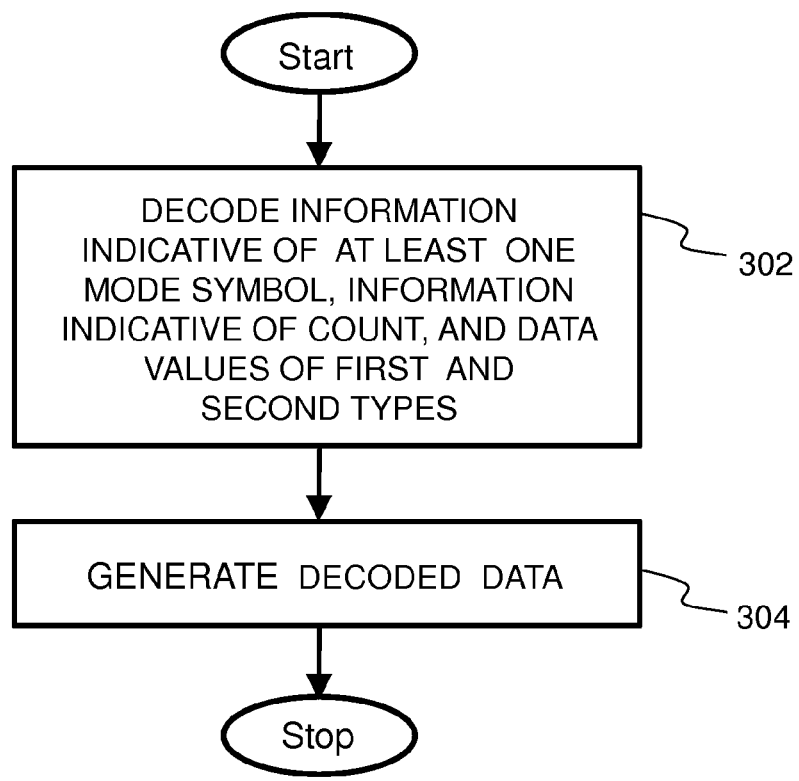
FIG. 3 is a schematic illustration of a flow chart depicting steps of a method of decoding encoded data (E2) to generate corresponding decoded data (D3), in accordance with an embodiment of the present disclosure.

Referring now to FIG. 3, there is provided a flow chart depicting steps of a method of decoding encoded data (E2) to generate corresponding decoded data (D3), in accordance with an embodiment of the present disclosure. The method is depicted as a collection of steps in a logical flow diagram, which represents a sequence of steps that can be implemented in hardware, software, or a combination thereof, for example as aforementioned.

At a step 302, information that is indicative of at least one mode symbol, information that is indicative of a count of non-mode symbols, data values of a first type including non-mode symbols and data values of a second type including runs of the at least one mode symbol are decoded from the encoded data (E2).

At a step 304, corresponding runs of the at least one mode symbol are inserted before or after the non-mode symbols to generate the decoded data (D3).

The steps 302 to 304 are only illustrative and other alternatives can also be provided where one or more steps are added, one or more steps are removed, or one or more steps are provided in a different sequence without departing from the scope of the claims herein.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

REFERENCES

[1] Run-length encoding—Wikipedia, the free encyclopedia (accessed Mar. 25, 2015); URL: http://en.wikipedia.org/wiki/Run-length_encoding

[2] Data Encoder, Data Decoder and Method (accessed Mar. 25, 2015); URL: http://gurulogic.com/files/US8823560B1.pdf
[3] Proposal for a new zlib strategy: Z_RLE (accessed Mar. 25, 2015); URL: http://optipng.sourceforge.net/pngtech/z_rle.html
[4] ENCODER APPARATUS, DECODER APPARATUS AND METHOD (accessed Mar. 25, 2015); URL: http://gurulogic.com/files/US8933826B2.pdf
[5] Entropy Modifier and Method (accessed Mar. 25, 2015) URL: http://gurulogic.com/files/US8754791B1.pdf
[6] Encoder and Method (accessed Mar. 25, 2015); URL: http://gurulogic.com/files/US8675731B2.pdf
[7] Decoder and Method (accessed Mar. 25, 2015); URL: http://gurulogic.com/files/US2014044191A1.pdf.

I claim:

1. An encoder for encoding input data to generate corresponding encoded data, characterized in that:
the encoder is configured to:
(a) analyze the input data to identify at least one mode symbol therein;
(b) generate data values of at least a first type and a second typefrom the input data, wherein the data values of the first type include non-mode symbols, and the data values of the second type include runs of the at least one mode symbol, wherein the at least one mode symbol is a symbol that occurs most often in the input data and the non-mode symbols are symbols other than the at least one mode symbol, wherein the runs of the at least one mode symbol are indicative of occurrences of the at least one mode symbol before or after the non-mode symbols within the input data;
(c) generate information that is indicative of a count of the non-mode symbols in the input data and information that is indicative of the at least one mode symbol; and
(d) assemble or encode the information that is indicative of the at least one mode symbol, the information that is indicative of the count of the non-mode symbols, the data values of the first type including the non-mode symbols and the data values of the second type including the runs of the at least one mode symbol, to generate the encoded data.

2. The encoder of claim 1, characterized in that the encoder is configured to insert the data values of the first type and the data values of the second type into one or more data streams, prior to (d).

3. The encoder of claim 2, characterized in that when inserting into the one or more data streams, the encoder is configured to insert the data values of the first type and the data values of the second type into separate data streams.

4. The encoder of claim 2, characterized in that the encoder is configured to recursively process a given data stream including the non-mode symbols pursuant to (a) to (d).

5. The encoder of claim 2, characterized in that when inserting into the one or more data streams, the encoder is configured to insert the data values of the first type and the data values of the second type in an interleaved format or a planar format into a single data stream.

6. The encoder of claim 2, characterized in that the encoder is configured to employ at least one entropy encoding method to compress the one or more data streams either together or separately.

7. The encoder of claim 6, characterized in that the at least one entropy encoding method includes at least one of: Delta encoding, ODelta encoding, RLE encoding, SRLE encoding, ZRLE encoding, MRLE encoding, SMRLE encoding, Huffman coding, VLC encoding, Range coding, Arithmetic coding, EM encoding, Continuum operator encoding, True-Bits Copy coding.

8. The encoder of claim 1, characterized in that the encoder is configured to assemble or encode additional information relating to delivery of at least one of: probability and index tables, mode symbols, counts of mode symbols, indices of selected encoding methods, data values, maximum indices of different data.

9. The encoder of claim 8, characterized in that the encoder is configured to deliver, to at least one decoder, an index that is indicative of at least one of: a selected encoding method, the at least one mode symbol, the count of mode symbols, whether or not the at least one mode symbol is communicated in the encoded data.

10. The encoder of claim 8, characterized in that the encoder is configured to deliver the additional information as prior information before delivery of the encoded data.

11. The encoder of claim 8, characterized in that the encoder is configured to deliver the additional information together with the encoded data as a part of the encoded data.

12. The encoder of claim 1, characterized in that the encoder is configured to dynamically select, from amongst a plurality of encoding algorithms, an encoding algorithm to be employed in (a) to (d), depending upon one or more properties of the input data, to obtain an improved degree of data compression in the encoded data.

13. A method of encoding input data in an encoder to generate corresponding encoded data, characterized in that the method includes:
(a) analyzing, by an encoder, the input data to identify at least one mode symbol therein;
(b) generating, by the encoder, data values of at least a first type and a second type from the input data, wherein the data values of the first type include non-mode symbols, and the data values of the second type include runs of the at least one mode symbol, wherein the at least one mode symbol is a symbol that occurs most often in the input data and the non-mode symbols are symbols other than the at least one mode symbol, wherein the runs of the at least one mode symbol are indicative of occurrences of the at least one mode symbol before or after the non-mode symbols within the input data;
(c) generating, by the encoder, information that is indicative of a count of the non-mode symbols in the input data and information that is indicative of the at least one mode symbol; and
(d) assembling or encoding, by the encoder, the information that is indicative of the at least one mode symbol, the information that is indicative of the count of the non-mode symbols, the data values of the first type including the non-mode symbols and the data values of the second type including the runs of the at least one mode symbol, to generate the encoded data.

14. The method of claim 13, characterized in that the method includes inserting, by the encoder, the data values of the first type and the data values of the second type into one or more data streams, prior to step (d).

15. The method of claim 14, characterized in that the method includes recursively processing, by the encoder, a given data stream including the non-mode symbols pursuant to (a) to (d).

16. The method of claim 13, characterized in that the method includes dynamically selecting, by the encoder, from amongst a plurality of encoding algorithms, an encoding algorithm to be employed in (a) to (d), depending upon one or more properties of the input data, to obtain an improved degree of data compression in the encoded data.

17. A decoder for decoding encoded data to generate corresponding decoded data, characterized in that:
(i) the decoder is configured to decode from the encoded data information that is indicative of at least one mode symbol, information that is indicative of a count of non-mode symbols, data values of at least a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data; and
(ii) the decoder is configured to insert before or after the non-mode symbols corresponding runs of the at least one mode symbol to generate the decoded data.

18. The decoder of claim 17, characterized in that the decoder is configured to receive within the encoded data one or more data streams including the data values of the first type and the data values of the second type.

19. The decoder of claim 17, characterized in that the decoder is configured to recursively process (i) to (ii) for each mode symbol to generate the decoded data, when more than one mode symbol are employed in the encoded data.

20. The decoder claim 17, characterized in that the decoder is configured to receive additional information relating to at least one of: probability and index tables, mode symbols, counts of mode symbols, indices of selected encoding methods, data values, maximum indices of different data.

21. The decoder of claim 20, characterized in that the decoder is configured to receive, from a corresponding encoder, an index that is indicative of at least one of: a selected encoding method, the at least one mode symbol, the count of mode symbols, whether or not the at least one mode symbol is communicated in the encoded data.

22. A method of decoding encoded data to generate corresponding decoded data, characterized in that the method includes:
(i) decoding, by a decoder, from the encoded data information that is indicative of at least one mode symbol, information that is indicative of a count of non-mode symbols, data values of a first type and a second type, the data values of the first type including non-mode symbols and the data values of the second type including runs of the at least one mode symbol, wherein the runs of the at least one mode symbol are indicative of occurrences of the at least one mode symbol before or after the non-mode symbols within original input data; and
(ii) inserting, by the decoder, before or after the non-mode symbols corresponding runs of the at least one mode symbol to generate the decoded data.

23. The method of claim 22, characterized in that the method includes receiving, by the decoder, within the encoded data one or more data streams including the data values of the first type and the data values of the second type.

24. The method of claim 22, characterized in that the method includes recursively processing, by the decoder, (i) to (ii) for each mode symbol to generate the decoded data, when more than one mode symbol are employed in the encoded data.

25. A codec including at least one encoder of claim 1 for encoding input data to generate corresponding encoded data, and at least one decoder for decoding the encoded data to generate corresponding decoded data.

26. A computer program product comprising a non-transitory computer-readable storage medium having computer-readable instructions stored thereon, the computer-readable instructions being executable by a computerized device comprising processing hardware to execute a method comprising:
(a) analyzing the input data to identify at least one mode symbol therein;
(b) generating data values of at least a first type and a second type, from the input data, wherein the data values of the first type include non-mode symbols, and the data values of the second type include runs of the at least one mode symbol, wherein the at least one mode symbol is a symbol that occurs most often in the input data and the non-mode symbols are symbols other than the at least one mode symbol, wherein the runs of the at least one mode symbol are indicative of occurrences of the at least one mode symbol before or after the non-mode symbols within the input data;
(c) generating information that is indicative of a count of the non-mode symbols in the input data and information that is indicative of the at least one mode symbol; and
(d) assembling or encoding the information that is indicative of the at least one mode symbol, the information that is indicative of the count of the non-mode symbols, the data values of the first type including the non-mode symbols and the data values of the second type including the runs of the at least one mode symbol, to generate the encoded data.

\* \* \* \* \*